United States Patent [19]

Mizuta

[11] Patent Number: 4,912,346

[45] Date of Patent: Mar. 27, 1990

[54] INPUT/OUTPUT CIRCUIT FOR IC CARD

[75] Inventor: Masaharu Mizuta, Itami, Japan

[73] Assignee: Mitsubishi Denki Kabushiki Kaisha, Japan

[21] Appl. No.: 305,022

[22] Filed: Feb. 2, 1989

[30] Foreign Application Priority Data

Jul. 18, 1988 [JP] Japan .................................. 63-176992

[51] Int. Cl.$^4$ ..................... H03K 17/30; H03K 19/092
[52] U.S. Cl. ..................................... 307/475; 307/443; 307/296.4; 365/228
[58] Field of Search ............ 307/443, 473, 475, 296.3, 307/296.4; 364/273.1, 273.4, 268, 707; 365/227, 228, 229

[56] References Cited

U.S. PATENT DOCUMENTS

| | | | |
|---|---|---|---|
| 3,859,638 | 1/1975 | Hume, Jr. ........................... | 365/228 |
| 4,587,640 | 5/1986 | Saitoh ................................. | 365/229 |
| 4,612,461 | 9/1986 | Sood .................................... | 307/475 |
| 4,791,323 | 12/1988 | Austin ................................. | 307/475 |
| 4,849,660 | 7/1989 | Hayashi et al. ..................... | 307/475 |

Primary Examiner—Andrew J. James
Assistant Examiner—Richard Roseen
Attorney, Agent, or Firm—Leydig, Voit & Mayer

[57] ABSTRACT

An input/output IC gate circuit inserted in the input or output lines of an IC memory card contains at least one input stage, for one of the input or output lines, in which a first MOSFET, a second MOSFET and a third MOSFET are connected in series between an external power source line and a grounding line. The first MOSFET is in an ON state when the voltage of the input or output line is in the vicinity of that of a power source and in an OFF state when the voltage is at 0 V. The second MOSFET is in an OFF state when the voltage of the input or output line is in the vicinity of the power source and in an ON state when the voltage is at 0 V. The third MOSFET is on/off controlled by a control signal delivered from a level detection circuit. The third MOSFET is turned on when the voltage of the external power source line exceeds a predetermined value which is one-half the voltage of the data backup battery or above.

5 Claims, 5 Drawing Sheets (a) INPUT VOLTAGE (b) THROUGH CURRENT

INPUT/OUTPUT CIRCUIT FOR IC CARD

BACKGROUND OF THE INVENTION

1. Field of the Invention:

The present invention relates to an IC memory card, and, more particularly, to an input/output circuit for a RAM card or the like which incorporates a data backup battery.

2. Description of the Related Art:

FIG. 1 is a block diagram of a conventional IC memory card which is described in "IC MEMORY CARD GUIDELINE" issued on September in 1986 by the Personal Computer Business Committee of the Japan Electrical Industry Development Association, and in particular shows the internal basic circuit of a RAM card. In FIG. 1, a RAM chip portion 2 generally includes a plurality of RAM chips (not shown). An interface connector 1, which connects the RAM card to an external circuit, is connected through a lower address bus 6 and a data bus 7 to individual RAM chips in the RAM chip portion 2. A chip select circuit 3 designed to select a specified RAM chip in the RAM chip portion 2 is connected to the interface connector 1 through a control bus 4 and an upper address bus 5. The chip select circuit 3 is also connected to the individual RAM chips in the RAM chip portion 2 through the control bus 4. An upper address represents an address used to determine which RAM chip in the RAM chip portion 2 is selected, and a lower address represents an address in each of the RAM chips. A power source control circuit 11 is connected via the interface connector 1 to an external power source (not shown) and the earth through an external power source line 8 indicated by a voltage Vcc and a grounding line 9 indicated by GND, respectively. The power source control circuit 11 is also connected through a power source line 10a indicated by a voltage Vbb to a date backup battery 10 (hereinafter referred to simply as a battery) incorporated in the RAM card to retain the data stored in the RAM chip portion 2 when the RAM card is disconnected from a personal computer or the like and no external power is supplied thereto. The power source control circuit 11 is also connected to the RAM chip portion 2 and the chip select circuit 3 through power source lines 11a to supply power thereto from the external power source or the battery 10. FIG. 1 does not refer to a practical situation, that is, it does not show a detailed circuit structure of the type required to cope with static electricity or other problems. In an actual circuit, however, a general-purpose gate IC (74HCXXX series) which resists static electricity relatively well is generally connected between the interface connector 1 and the RAM chip portion 2 in order to protect the RAM chip portion 2 which is vulnerable to disturbances such as static electricity. In particular, a general-purpose gate IC is inserted in the lower address bus 6 between the interface connector 1 and the RAM chip portion 2 because a signal on the lower address bus 6 is more vulnerable to static electricity than is a signal on the data bus 7.

FIG. 2 is a block diagram of parts of a conventional RAM card of FIG. 1, in which the same reference numerals are used to denote parts which are identical to those in FIG. 1. In the structure shown in FIG. 2, an input gate IC circuit 12, which is an input side gate circuit, is inserted in the lower address bus 6 to protect the RAM chip portion 2 against disturbances. The RAM chip portion 2 is connected between the external power source line 8 and the grounding line 9 and between the two ends of the battery 10 which supplies a 3 V of voltage for data backup. A pull-up resistor 13 for pulling up the voltage of the lower address bus 6 to the Vcc of the external power source line 8 is connected between the external power source line 6 and the lower address bus 6. A diode 14 is connected to the battery 10 to ensure that current does not flow backwards thereto. A level detection circuit 16 is designed to detect the voltage Vcc of the external power source line 8 and supply an ON(close)-signal to a transistor change-over switch 15 so that it closes when the voltage Vcc becomes about 4.4 V or above after the RAM card has been connected to a personal computer or the like (not shown) and the power has been turned on. The level detection circuit 16 creates an OFF(open)-signal so that the transistor change-over switch 15 opens when the voltage Vcc of the external power supply line 8 becomes 4.4 V or less after the power has been turned off. A control signal 16a is the signal for actuating this on-off control. The input gate IC circuit 12 improves the resistance of the RAM card to static electricity. IC circuit 12, by virtue of its signal amplification function, overcomes any problem that may occur involving a signal delay which depends on the storage capacity of the RAM chip portion 2 when the RAM chip portion 2 consists of a plurality of RAM chips. The level detection circuit 16 may be readily constructed by utilizing an IC which is available on the market under the name of reset IC. IT sends on ON(close)-signal to the transistor change-over switch 15 when the voltage Vcc of the external power source line 8 exceeds, for example, about 4.4 V, which is a value slightly higher than the lowest voltage at which the RAM chip portion 2 can operate normally. Circuit 16 thus enables data to be read out and written in the RAM chip portion 2 when the voltage Vcc is at a desired value or above.

FIG. 3 shows part of the pin layout of an IC chip frequently used as the input gate IC circuit 12 shown in FIG. 2, e.g., 74HC245. The pin arrangement includes a power source terminal 17, a grounding terminal 18, a data direction control input DIR terminal 19 and an output control input terminal 20. The data direction control input DIR terminal 19 and the output control input terminal 20 are connected to the grounding terminal 18. FIG. 4 shows a CMOS general-purpose logic gate, which is one of the inverter circuits provided at the input stage of the 74HC245 shown in FIG. 3. In this inverter circuit, a p-channel MOSFET 21 and an N-channel MOSFET 22 are connected in series. This inverter is provided for each signal line. That is, if the lower address line 6 is a signal line which transmits a 15-bit signal in parallel, the IC chip employs 15 inverters. Since either the upper half (the p-channel) or the lower half (the n-channel) is on all the time in this CMOS inverter circuit, d.c. current It (generally called through current) does not flow from the power source terminal 17 to the grounding terminal 18. When the input voltage Vin of the input gate IC circuit 12, i.e., the voltage of the lower address bus 6, is at 5 V, the p-channel MOSFET 21 is off while the n-channel MOSFET 22 is on. Further, when the input voltage of the lower address bus 6 is at 0 V, the MOSFET 21 is on, and the MOSFET 22 is off. In actual operation, however, both of the MOSFETs 21 and 22 are on for a short time during the input voltage waveform transition, and the through current as well as the load current flow in the inverter. FIG. 5 shows this effect. When the input voltage Vin gradually increases, as shown in FIG. 5(a), and the voltage V of the power source terminal 17 of the input gate IC circuit 12 is kept at 5 V, the through current It that flows between the power source terminal 17 and the ground terminal 18 of the input gate IC circuit 12 varies in the manner shown in FIG. 5 (b). The through current It is at a maximum when the input voltage Vin is about one-half the voltage V (which is 5 V) of the power source terminal 17. This through current It sometimes reaches several hundreds of $\mu$A in one CMOS inverter, which is too high a value to be ignored if the 74HC245 incorporates a large number of inverters.

While the RAM card is being carried from one place to another, a voltage is supplied to the RAM chip portion 2 from the battery 10 to retain the data stored therein. At this time, there is no voltage supply from the external power source line 8, and the transistor change-over switch 15 remains off while the address signal on the lower address bus 6 is at 0 V. When the RAM card is inserted in a personal computer or in a reader/writer for the IC memory card to allow data to be written in or data to be read from the RAM chip portion 2, a voltage is supplied from the external power source line 8, and data is accessed on the basis of address information. At this time, about 3 V has been already applied from the battery 10 to the power source terminal 17 of the input gate IC circuit 12, and the phenomenon illustrated in FIG. 5 occurs in the RAM card when either the voltage of the external power source line 8 or that of the lower address line 6 increases from 0 V to 5 V. In other words, when either the voltage of the external power source line 8 or that of the lower address line 6 is one-half that of the battery voltage, which is 3 V, the through current It flows in each of the inverters in the input gate IC circuit 12. It is the battery 10 which supplies this through current It, because the transistor change-over switch 15 is still off when the voltage of the external power source line is at 3/2 V. Further, the same phenomenon occurs when the external power source is turned off.

In the conventional RAM card arranged in the manner described above, each time the power is turned on and off after the card has been inserted into a personal computer or the like, excessive through current flows from the battery, consuming a great deal of power from battery and thereby decreasing the life of the battery.

SUMMARY OF THE INVENTION

In view of the above-described problems of the conventional IC memory card, an object of the present invention is to provide an input/output circuit for an IC memory card which is capable of providing a battery with a longer life and of reducing the frequency with which batteries have to be exchanged.

To this end, the present invention provides an input/output circuit for an IC memory card which incorporates a data backup battery and in which a memory chip portion is connected between an external power source line and a grounding line as well as between the two terminals of the data backup battery. The input/output circuit comprises a level detection circuit for detecting the level of a voltage of the external power source line and for generating a control signal when the voltage exceeds a predetermined voltage value which is one-half the voltage of the data backup battery, and when an input or output IC gate circuit inserted in input or output lines of the IC memory card. The circuit includes at least one input stage, for one of the input or output lines, in which a first MOSFET<a second MOSFET and a third MOSFET are connected in series between the external power source line and the grounding line, the first MOSFET being in an ON state when the voltage of the input line or the output line is in the vicinity of the voltage of an power source and in an OFF state when the voltage is at 0 V, the second MOSFET being in an OFF state when the voltage of the input line or the output line is in the vicinity of the voltage of the power source and in an ON state when the voltage is at 0 V, the third MOSFET being on/off controlled by the control signal from the level detecting circuit. The third MOSFET is controlled such that it is turned on when the voltage of the external power line exceeds the predetermined value.

In the present invention, the input stage of an input/output circuit for an IC memory card contains a p-channel MOSFET, an n-channel MOSFET and an additional p- or n-channel MOSFET. This additional MOSFET is on/off controlled by a control signal from a level detecting circuit capable of detecting the level of the voltage of an external power source line. When the voltage of the power source is at a voltage in which data in a RAM chip portion can be accessed, the input/output circuit is used for its original purposes. When the voltage is below that access voltage, in particular, when the voltage is about one-half that of an incorporated battery, the additional MOSFET is turned off in order not to pass through current in the input/output circuit.

DETAILED DESCRIPTION OF THE PREFERRED EMBODIMENTS

Figure 1:
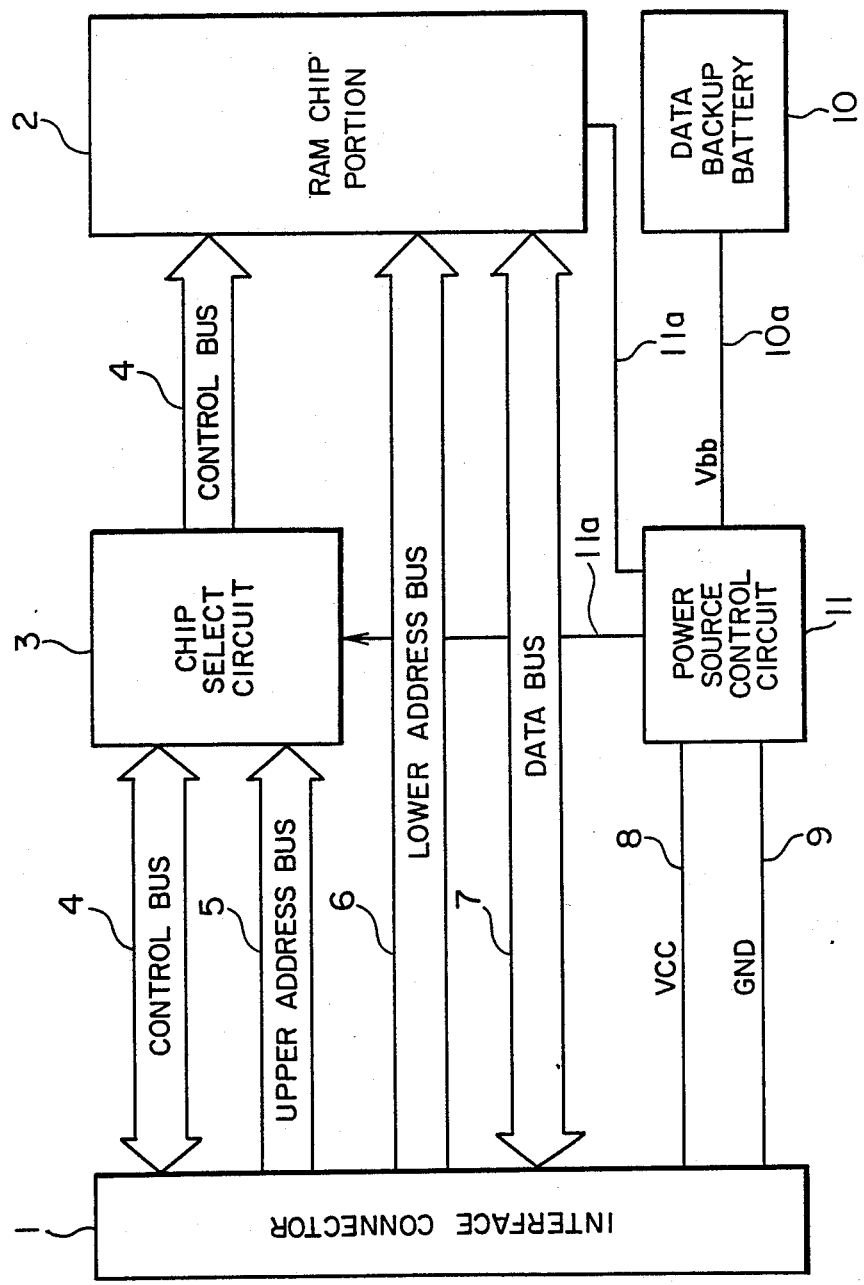
FIG. 1 is a block diagram of a conventional IC memory card, schematically showing the internal structure thereof.
Figure 2:
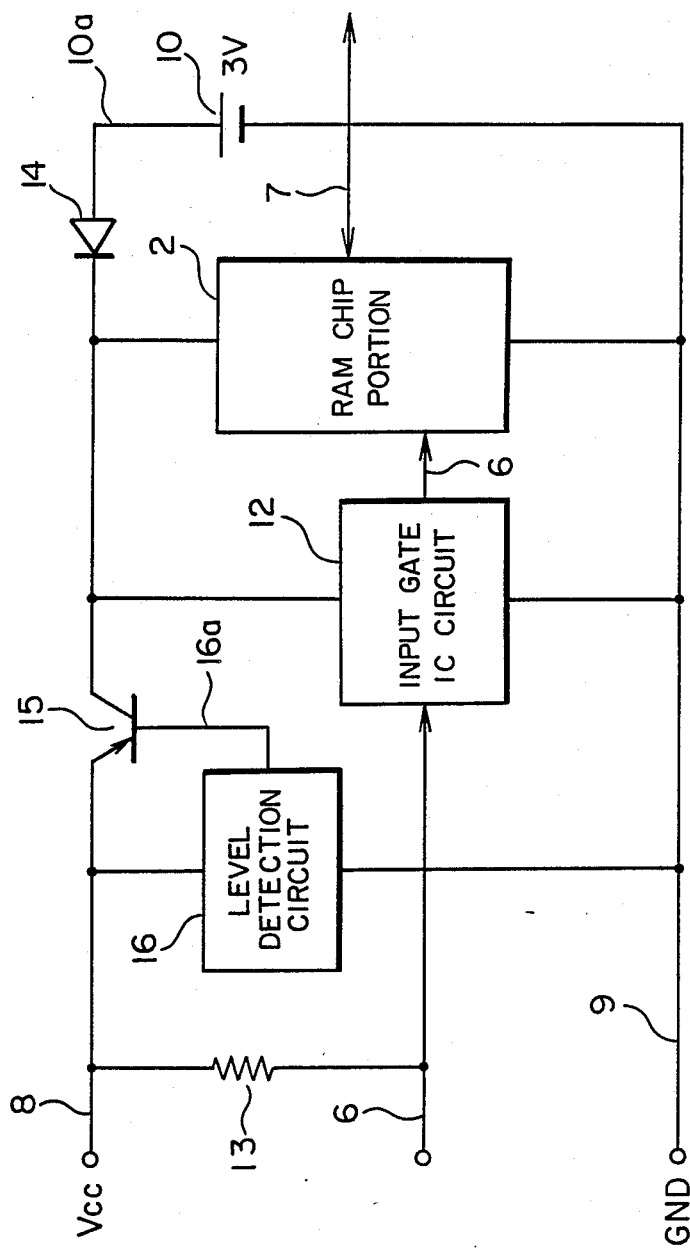
FIG. 2 is a circuit diagram of parts of the IC memory card of FIG. 1.
Figure 3:
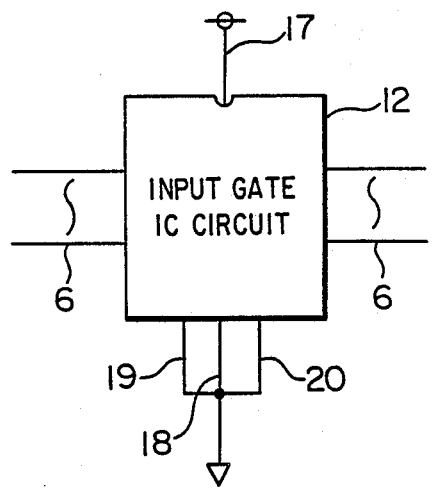
FIG. 3 shows the pin layout of an input gate IC circuit incorporated in the IC memory card of FIG. 2.
Figure 4:
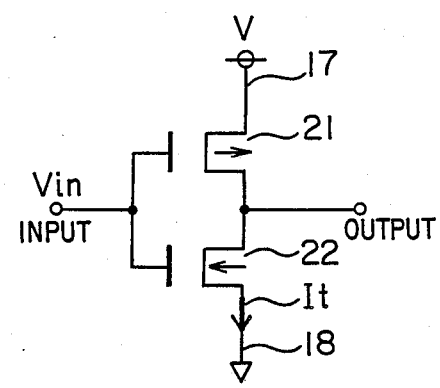
FIG. 4 is a circuit diagram of an inverter provided at the input stage of the input gate IC circuit of FIG. 3.
Figure 5:
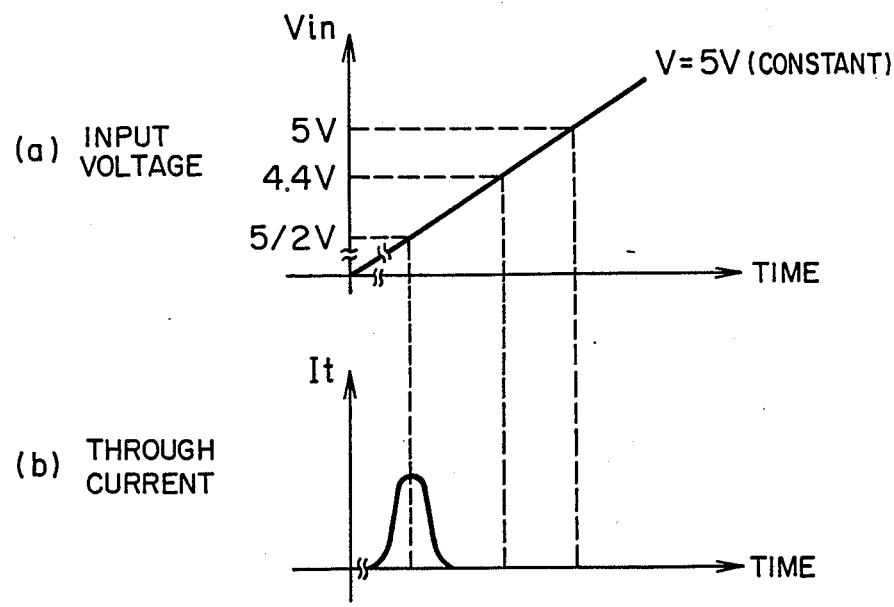
FIG. 5 is a graph, illustrating through current that flows in the inverter of FIG. 4.
Figure 6:
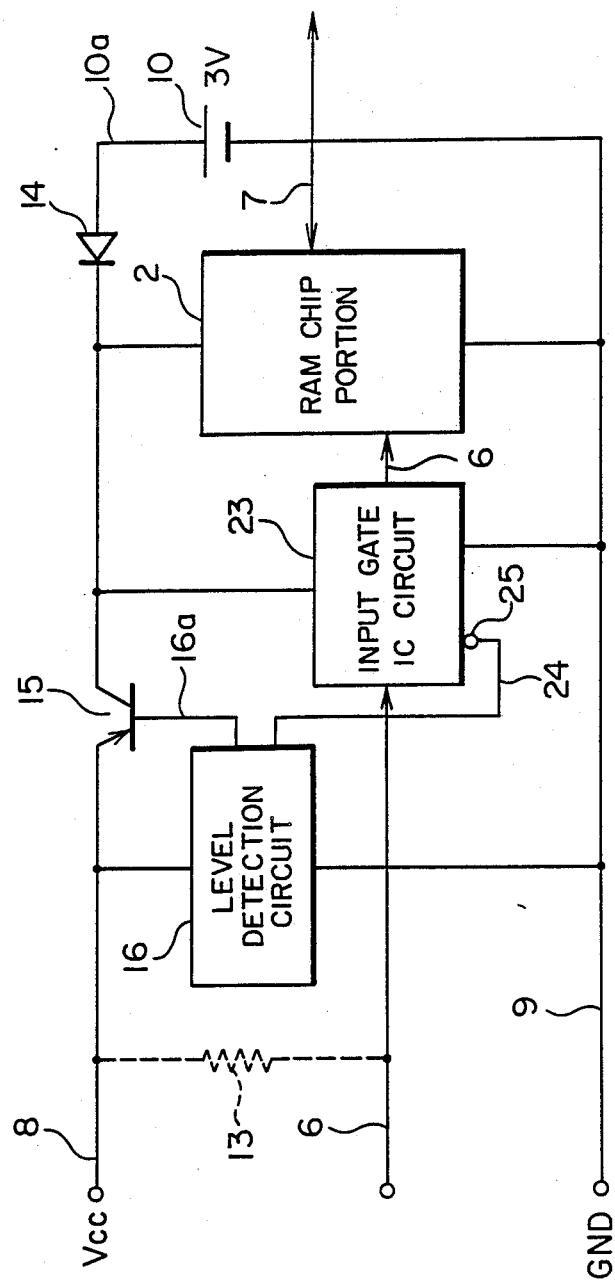
FIG. 6 is a circuit diagram of an IC memory card which incorporates a first embodiment of an input/output circuit acccording to the present invention.
Figure 7:
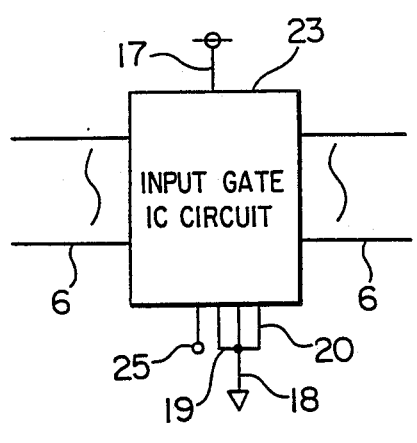
FIG. 7 shows the pin layout of part of the input gate IC circuit of FIG. 6.
Figure 8:
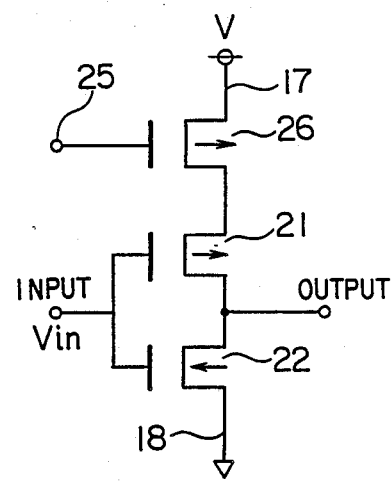
FIG. 8 is a circuit diagram of an inverter circuit provided at the input stage of the input gate IC circuit of FIG. 7.
Figure 9:
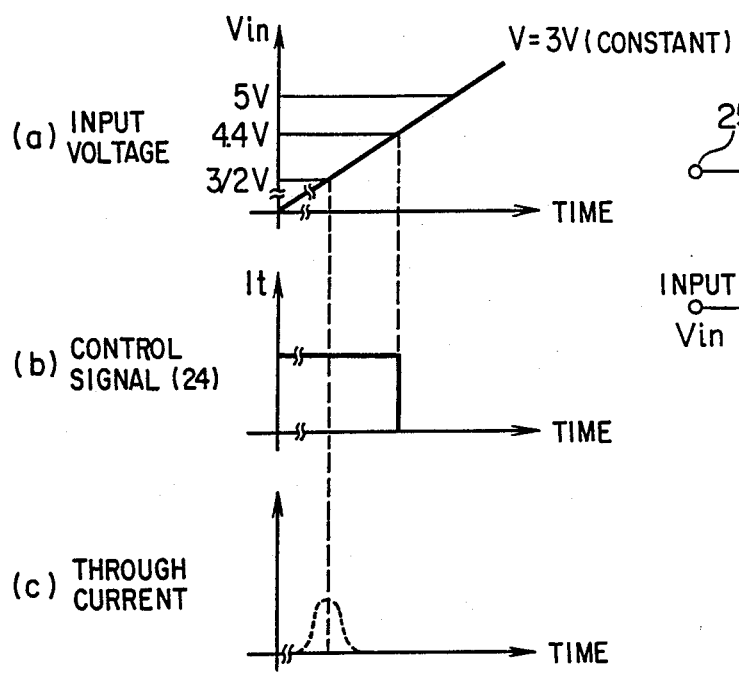
FIG. 9 is a graph, illustrating through current that flows in the inverter circuit of FIG. 8.

The present invention will be described below by way of example. FIG. 6 is a circuit diagram of parts of a first embodiment of an IC memory card incorporating an input/output circuit according to the present invention. In FIG. 6, the same reference numerals are used to denote parts which are the same as those in FIG. 2. An input gate IC circuit 23, which is capable of blocking through current, is controlled by a through current blocking control signal which is delivered from the level detecting circuit 16. This through current blocking control signal 24 changes its state, like the control signal 16a for controlling the on/off state of the transistor switch-over switch 15, when the voltage Vcc of the external power source line 8 reaches about 4.4 V. FIG. 7 shows part of the pin layout of the input gate IC circuit 23. It includes a through current blocking control terminal 25 to which the through current blocking control control signal 24 is delivered from the level detection circuit 16. FIG. 8 shows an inverter circuit which is provided at the input stage of the input gate IC circuit 23. The inverter circuit contains a first MOSFET 22 which is an N-channel MOSFET, a second MOSFET 21 which is a P-channel MOSFET, and a third MOSFET 26 which is a P-channel. The gate terminal of the third MOSFET 26 is connected to the through current blocking control terminal 25. FIG. 9 shows how the level of the through current blocking control signal 24 output from the level detection circuit 16 (FIG. 9 (b)) and that of the through current It that flows between the power source terminal 17 and the grounding terminal 18 in the inverter circuit shown in FIG. 8 (FIG. 9 (c)) change when the power is turned on. The voltage Vcc of the external power source line 8 and the input voltage Vin gradually rise, as shown in FIG. 9 (a), after the RAM card has been connected to a personal computer or the like in a state where 3 V is being applied to the RAM chip portion 2 from the battery 10 shown in FIG. 6. In this state, 3 V is also applied to the power source terminal 17 of the inverter circuit shown in FIG. 8. As can be seen from FIG. 9, the through current blocking control signal 24 of the level detection circuit 16 is supplied to the control terminal 25 of the input gate IC circuit 23 until the voltage Vcc of the external power line 8 becomes about 4.4 V to maintain the p-channel MOSFET 26 in an off state. No through current therefore flows in the input gate IC circuit 23. This effect also applies to a case where the power is turned off. Thus, the input gate IC circuit 23 is arranged such that no through current flows therein. As a result, reduction in the life of the battery 10 which occurs due to an excessive amount of through current It that flows when the power is turned on and off after the RAM card has been inserted in a personal computer or the like can be eliminated.

The above-described embodiment is described as applied to an input gate IC circuit which is inserted in the lower address bus 6 in the RAM card. However, the present invention is not so limited but may also be applied to an input gate IC circuit which is inserted in the data bus 7, the control bus 4, the upper address bus 5 or the other lines. The present invention may also be applied to an output gate IC circuit which is inserted in the control bus 4, the data bus 7 or the other lines.

Figure 10:
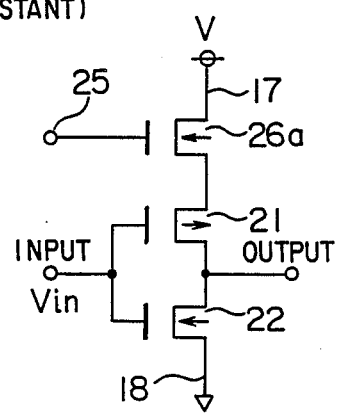
FIG. 10 is a circuit diagram of an inverter circuit provided at the input stage of the input gate IC circuit, showing another embodiment of the present invention.

In this embodiment, the input gate IC circuit contains the p-channel MOSFET 26 which acts as the third MOSFET for blocking through current. However, the third MOSFET may be an N-channel MOSFET 26a, as shown in FIG. 10. In that case, a through current blocking control signal 24 has to have a level opposite to that of the control signal shown in FIG. 9. That is, a through current blocking control signal having a low level is applied to the control terminal 25 until the voltage Vcc of the external power source line 8 becomes about 4.4 V, and a through current blocking control signal having a high level is applied when the voltage Vcc extends about 4.4 V.

Further, since the pull-up resistor 13 shown in FIG. 6 by the broken line is provided to fix the input voltage of the CMOS to that of the external power source line 8 when the CMOS input is unstable, it may be eliminated in the present invention, thus providing a IC memory card which is small in size and inexpensive.

As will be understood from the foregoing description, in the present invention, an additional transistor element the on/off state of which is controlled by a control signal output from a level detection circuit for detecting the voltage of an external power source line is connected in series with the existing transistor elements. That additional transistor element is controlled such that it remains off until the voltage on the external power source line reaches a predetermined value or above (which is onehalf that of the data backup battery or above). In consequence, the flow of through current in an input gate IC circuit or an output gate IC circuit, which occurs when the power is turned on and off, can be prevented, enabling the life of a battery to be prolonged and the frequency with which batteries have to be exchanged to be reduced.

What is claimed is:

1. An input/output circuit for an IC memory card which incorporates a data backup battery and in which a memory chip portion is connected to an external power source line and a grounding line and between the terminals of said data backup battery comprising:
   a voltage level detection circuit for detecting the level of a voltage of an external power source line and for generating a control signal when the voltage exceeds a predetermined voltage value which is one-half the voltage of a data backup battery, and
   an IC gate circuit for insertion in input and output lines of said IC memory card and including at least one input stage for one of the input or output lines in which a first MOSFET, a second MOSFET, and a third MOSFET are connected in series between the external power source line and the grounding line, said first MOSFET being in an ON state when the voltage of said input or output line is approximately equal to the voltage of the external power source and in an OFF state when the voltage is zero, said second MOSFET being in an OFF state when the voltage of said input or output line is approximately equal to the voltage of the external power source and in an ON state when the voltage is zero, the on/off state of said third MOSFET being controlled by the control signal produced by said level detecting circuit,
   wherein said third MOSFET is placed in an ON state when the voltage of said exernal power line exceeds the predetermined voltage value.

2. An input/output circuit for an IC memory card according to claim 1 wherein said first MOSFET is a p-channel MOSFET, said second MOSFET is an n-channel MOSFET, and said third MOSFET is a p-channel MOSFET.

3. An input/output circuit for an IC memory card according to claim 1 wherein said first MOSFET is a p-channel MOSFET, said second MOSFET is an n-channel MOSFET, and said third MOSFET is an n-channel MOSFET.

4. An input/output circuit for an IC memory card according to claim 1 wherein said input or output line of said IC memory is a lower address bus.

5. An input/output circuit for an IC memory card according to claim 1 wherein the voltage of said data backup battery is 3 V, and said third MOSFET is placed in an ON state when the voltage of said external power source line exceeds about 4.4 V.

* * * * *